United States Patent
Lee et al.

(10) Patent No.: US 7,781,298 B2
(45) Date of Patent: Aug. 24, 2010

(54) METHODS FOR FABRICATING A CAPACITOR

(75) Inventors: Hengyuan Lee, Tainan County (TW); Lurng-Shehng Lee, Hsinchu County (TW); Ching Chiun Wang, Miaoli County (TW); Pei-Jer Tzeng, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 271 days.

(21) Appl. No.: 12/168,016

(22) Filed: Jul. 3, 2008

(65) Prior Publication Data

US 2008/0268593 A1    Oct. 30, 2008

Related U.S. Application Data (62) Division of application No. 11/485,236, filed on Jul. 11, 2006, now Pat. No. 7,405,122.

(30) Foreign Application Priority Data

Apr. 12, 2006    (TW) ............................... 95112988 A (51) Int. Cl.
    *H01L 21/00*    (2006.01)
(52) U.S. Cl. .................. 438/396; 438/239; 438/253; 438/255; 438/397; 438/398; 257/E21.002; 257/E21.016; 257/E21.019; 257/E21.648; 257/E21.655; 257/E21.657; 257/E27.089
(58) Field of Classification Search ......... 438/253–268, 438/395–399; 257/E21.002, 16–19, 648–657, 257/27.089
See application file for complete search history.

(56) References Cited

U.S. PATENT DOCUMENTS

| | | | | |
|---|---|---|---|---|
| 5,670,405 | A * | 9/1997 | Tseng | 438/253 |
| 5,856,220 | A * | 1/1999 | Wang et al. | 438/254 |
| 6,159,789 | A * | 12/2000 | Chuang et al. | 438/253 |
| 6,312,985 | B1 * | 11/2001 | Wu et al. | 438/253 |
| 6,670,238 | B2 * | 12/2003 | Deboer et al. | 438/255 |
| 6,825,081 | B2 * | 11/2004 | Zheng | 438/253 |
| 7,321,150 | B2 * | 1/2008 | Fishburn et al. | 257/309 |
| 7,524,774 | B2 * | 4/2009 | Sasaki et al. | 438/775 |
| 2007/0141777 | A1 * | 6/2007 | Fishburn et al. | 438/243 |
| 2007/0243690 | A1 * | 10/2007 | Lee et al. | 438/396 |

* cited by examiner

*Primary Examiner*—Michael S Lebentritt
(74) *Attorney, Agent, or Firm*—Quintero Law Office (57) ABSTRACT

A method for forming a capacitor comprises providing a substrate. A bottom electrode material layer is formed on the substrate. A first mask layer is formed on the bottom electrode material layer. A second mask layer is formed on the first mask layer. The second mask layer is patterned to form a patterned second mask layer in a predetermined region for formation of a capacitor. A plurality of hemispherical grain structures are formed on a sidewall of the patterned second mask layer. The first mask layer is etched by using the hemispherical grain structures and the patterned second mask layer as a mask, thereby forming a patterned first mask layer having a pattern. The pattern of the first mask layer is transferred to the bottom electrode material layer. And, a capacitor dielectric layer and a top electrode layer are formed on the bottom electrode material layer to form the capacitor.

18 Claims, 9 Drawing Sheets

METHODS FOR FABRICATING A CAPACITOR

This application is a divisional of U.S. application Ser. No. 11/485,286, file Jul. 11, 2006, the entire disclosure of which is hereby incorporated by reference.

BACKGROUND OF THE INVENTION

1. Field of the Invention

The present invention relates to methods for fabricating semiconductor devices, and in particular to methods for fabricating capacitors.

2. Description of the Related Art

The development trend in the rapidly evolving integrated circuit industry is toward high performance, miniaturization, and high operating speed. Dynamic random access memory (DRAM) fabrication methods have also developed rapidly. More specifically, shrinking design dimensions is a strategic aim. However, as each memory cell shrinks, a capacitor must maintain a certain charge storage capacity, for example more than 25 fF, to ensure reliable operation of the memory cell.

A DRAM cell typically comprises a transistor and a capacitor. The capacitor is formed by disposing a dielectric material between two electrode plates. The capacitance is represented as C=KA/D, wherein K is the dielectric constant of the dielectric material in the capacitor; A is the electrode area; and D is the distance between two electrode plates. To increase capacitance without enlarging the area occupied by the DRAM cell on the wafer, a high-k dielectric material is used to form the dielectric layer between the electrode plates. Alternatively, growth of HSG silicon (hemispherical grained silicon) on the surface of the top and/or bottom electrode plate is used to increase the surface area of the electrode plates. U.S. Pat. No. 6,300,192 by Kim entitled as "METHOD FOR FABRICATING A DRAM CELL CAPACITOR USING HEMISPHERICAL GRAIN (HSG) SILICON", discloses forming HSG silicon on the polysilicon plate by performing a seeding method in a stacked capacitor structure. However, this skill is limited to the bottom electrode material, which must be polysilicon for growth of HSG silicon. As metal is needed for the electrode plate, the conventional technology for increasing the surface area of the electrode plate by growing HSG silicon on the polysilicon electrode is not suitable for use in the manufacturing process. Hence, a new method for increasing the surface area of the electrodes to raise capacitance without additional photolithography mask is needed.

BRIEF SUMMARY OF THE INVENTION

A detailed description is given in the following embodiments with reference to the accompanying drawings.

Methods for fabricating a semiconductor device are provided. An exemplary embodiment of a method of fabricating a capacitor comprises providing a substrate; a bottom electrode material layer is formed on the substrate; a first mask layer is formed on the bottom electrode material layer; a second mask layer is formed on the first mask layer; the second mask layer is patterned to form a patterned second mask layer in a predetermined region for formation of a capacitor; a plurality of hemispherical grain structures are formed on a sidewall of the patterned second mask layer; the first mask layer is etched by using the hemispherical grain structures and the patterned second mask layer as a mask, thereby forming a patterned first mask layer having a pattern. The pattern of the first mask layer is transferred to the bottom electrode material layer, and a capacitor dielectric layer and a top electrode layer are formed on the bottom electrode material layer to form the capacitor.

Methods for forming a semiconductor device are provided. An exemplary embodiment of a method for forming a capacitor comprises providing a substrate; a material layer is formed on the substrate; a first mask layer is formed on the material layer; a second mask layer is formed on the first mask layer; the second mask layer is patterned to form a first opening therein, wherein the first opening is in a predetermined region for formation of a capacitor; a plurality of hemispherical grain structures are formed on a sidewall of the patterned second mask layer in the first opening; the first mask layer is etched by using the hemispherical grain structures and the patterned second mask layer as a mask, thereby forming a patterned first mask layer having a pattern and a second opening therein. The pattern of the patterned first mask layer is transferred to the material layer to form a patterned material layer with a third opening therein. A bottom electrode material layer is formed on a sidewall of the patterned material layer in the third opening. The patterned material layer is removed, and a capacitor dielectric layer and a top electrode layer are formed on the bottom electrode material layer to form the capacitor.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Methods for forming a semiconductor device are provided. An exemplary embodiment of a method for forming a capacitor comprises providing a substrate. A bottom electrode material layer is formed on the substrate. A first mask layer is formed on the bottom electrode material layer. A second mask layer is formed on the first mask layer. The second mask layer is patterned to form a patterned second mask layer in a predetermined region for formation of a capacitor. A plurality of hemispherical grain structures are formed on a sidewall of the patterned second mask layer. The first mask layer is etched by using the hemispherical grain structures and the patterned second mask layer as a mask, thereby forming a patterned first mask layer having a pattern. The pattern of the first mask layer is transferred to the bottom electrode material layer. And, a capacitor dielectric layer and a top electrode layer are formed on the bottom electrode material layer to form the capacitor.

Methods for forming a semiconductor device are provided. An exemplary embodiment of a method for forming a capacitor comprises providing a substrate. A material layer is formed on the substrate. A first mask layer is formed on the material layer. A second mask layer is formed on the first mask layer. The second mask layer is patterned to form a first opening therein, wherein the first opening is in a predetermined region for formation of a capacitor. A plurality of hemispherical grain structures are formed on a sidewall of the patterned second mask layer in the first opening. The first mask layer is etched by using the hemispherical grain structures and the patterned second mask layer as a mask, thereby forming a patterned first mask layer having a pattern and a second opening therein. The pattern of the patterned first mask layer is transferred to the material layer to form a patterned material layer with a third opening therein. A bottom electrode material layer is formed on a sidewall of the patterned material layer in the third opening. The patterned material layer is then removed. And, a capacitor dielectric layer and a top electrode layer are formed on the bottom electrode material layer to complete fabrication of the capacitor.

Preferred embodiments of the invention providing methods for forming capacitors by using a pattern formed by self-aligned hemispherical grain structures as a mask and then transferring the pattern to a relatively thick mask. Use of the relatively thick mask and subsequent processes yields a capacitor having increased capacitance without requiring an additional photolithography mask. The preferred embodiments of the present invention will be described in greater detail in the following embodiments with reference to the accompanying drawings. It is noted that in accompanying drawings, like and/or corresponding elements are referred to by like reference numerals.

EMBODIMENT 1

Figure 1:
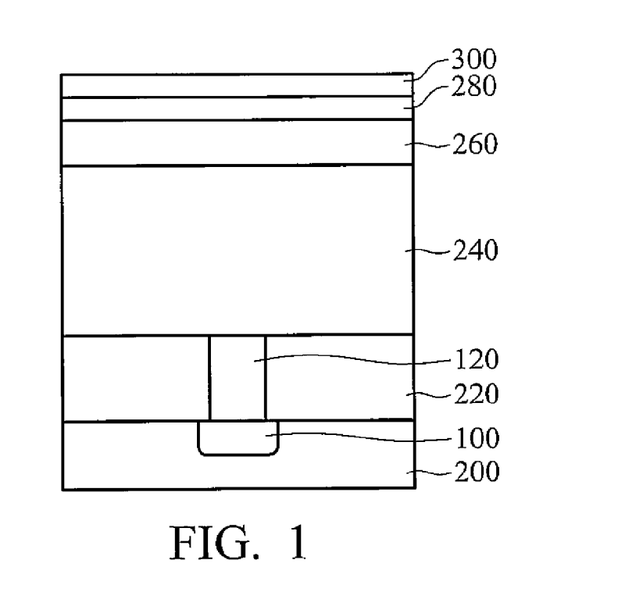
FIGS. 1-8 are schematic views showing an embodiment of a method for forming a capacitor.

A first embodiment of a method for forming a capacitor of the invention will now be described with reference to FIGS. 1-8. Referring to FIG. 1, an integrated circuit substrate 200 is provided. A transistor comprises a gate (not shown) and source/drain regions 100 is formed in and on the integrated circuit substrate 200. The integrated circuit substrate 200 may comprise silicon (Si), germanium (Ge), gallium arsenide (GaAs), strained silicon, SiGa, InP, diamond, an epitaxy layer, and/or similar. An interlayer dielectric layer 220 is then formed on the integrated circuit substrate 200. By using lithography and etching processes, the predetermined portion of the interlayer dielectric layer 220 is etched to form a contact hole. The contact hole exposes the source/drain region 100. The contact hole is then filled with a conductive material, thereby forming a contact plug 120 which electrically connects to the source/drain region 100 and a bottom electrode of DRAM formed in subsequent processes. The interlayer dielectric layer 220 may include silicon oxide, silicon oxynitride or other dielectric material. The conductive material for forming the contact plug 120 may include poly-Si, poly SiGe, molybdenum, tungsten or similar.

Next, a bottom electrode material layer 240 is deposited on the interlayer dielectric layer 220 and the contact plug 120. A first mask layer 260 is deposited on the bottom electrode material layer 240. A second mask layer 280 is deposited on the first mask layer 260. Finally, a photoresist layer 300 is formed on the second mask layer 280. The bottom electrode material layer 240 may comprise TiN, Ru, Pt, polysilicon (poly-Si) or other conductive material. The first mask layer 260 may comprise silicon oxide, silicon nitride or similar. Preferably, the first mask layer 260 has a thickness of about 100 nm to 500 nm. The second mask layer 280 may be made of a material having a high etching selectivity with respect to the first mask layer 260. For example, polysilicon or silicon nitride is preferably used for forming the second mask layer 280. The second mask layer 280 may have a thickness of about 10 nm to 100 nm. In a preferred embodiment of the invention, the first mask layer 260 is made of silicon oxide, and the second mask layer 280 is made of polysilicon.

Figure 2:
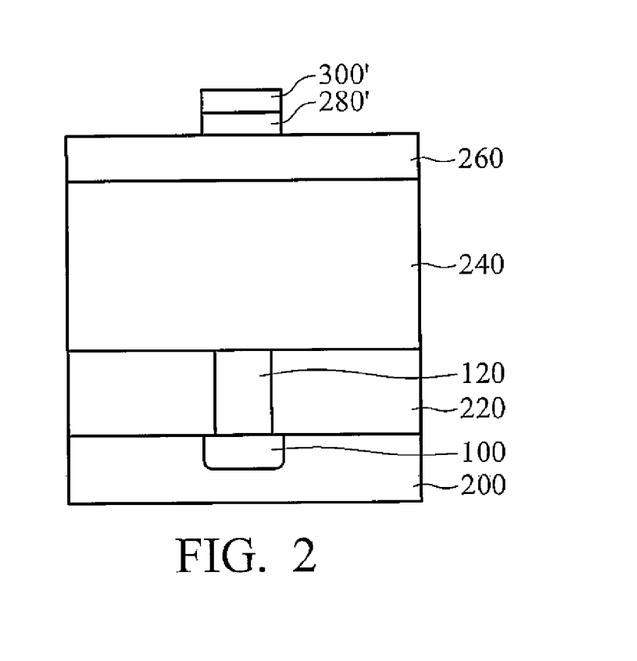

Referring now to FIG. 2, the photoresist layer 300 and the second mask layer 280 are patterned by photolithography and etching processes. The patterned photoresist layer 300' and the patterned second mask layer 280' are disposed in a predetermined region, in which a capacitor will be formed. The patterned photoresist layer 300' is then removed, while the patterned second mask layer 280' remains.

Figure 3:
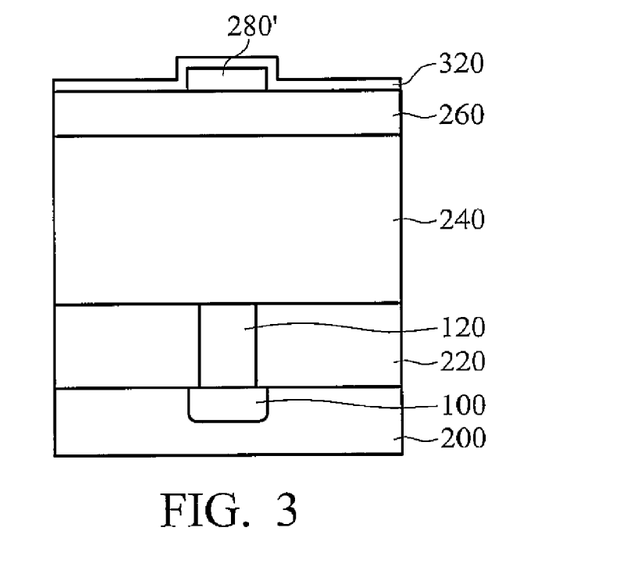

Referring to FIG. 3, a seeding layer 320 is conformally deposited on the patterned second mask layer 280' and the uncovered portion of the first mask layer 260. The seeding layer 320 preferably comprises a material which can be transformed into a hemispherical grain structure or nano crystal by performing a heat treatment or other similar methods. Preferably, silicon, germanium or PtO is utilized to the seeding layer 320. In a preferred embodiment of the invention, the seeding layer 320 is made of amorphous silicon (a-Si).

Figure 4:
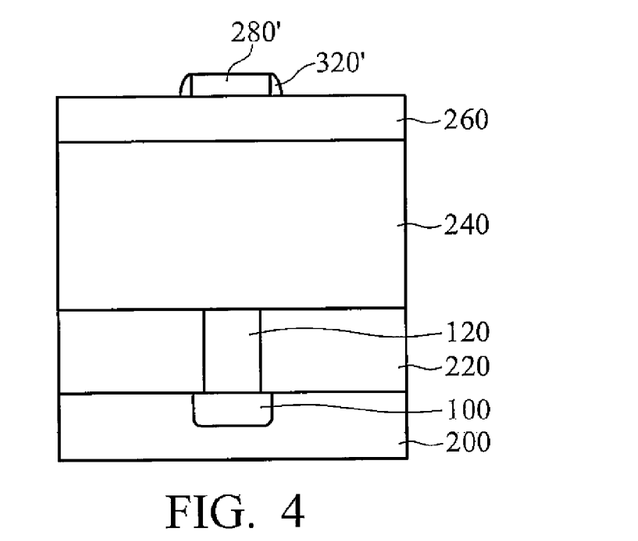
Figure 5:
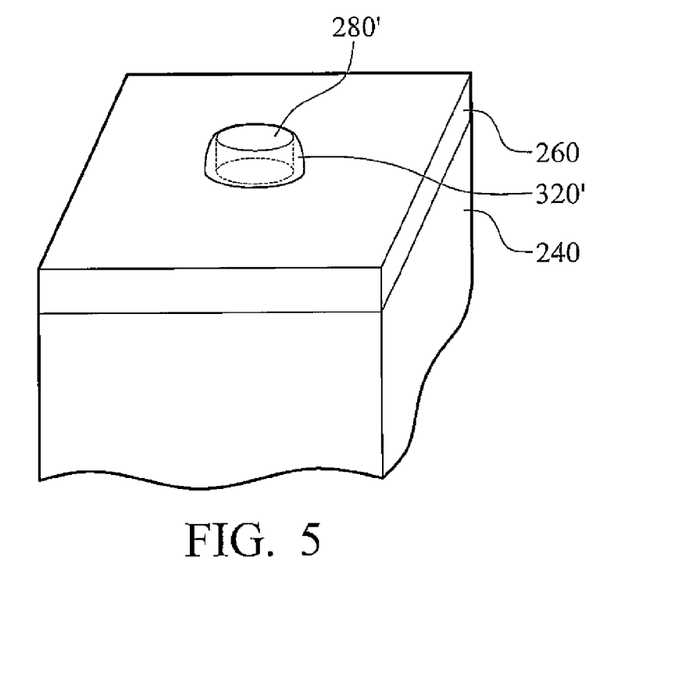

Referring to FIG. 4, an anisotropic etching is carried out to etch the seeding layer 320 on the first mask layer 260 and on the top portion of the patterned second layer 280'. Thus, a patterned seeding layer 320' is formed on a sidewall of the patterned second mask layer 280'. The anisotropic etching may include plasma etching or reactive ion etching (RIE). A top view of the resulting structure after completion of the etching process is illustrated in FIG. 5.

Figure 6:
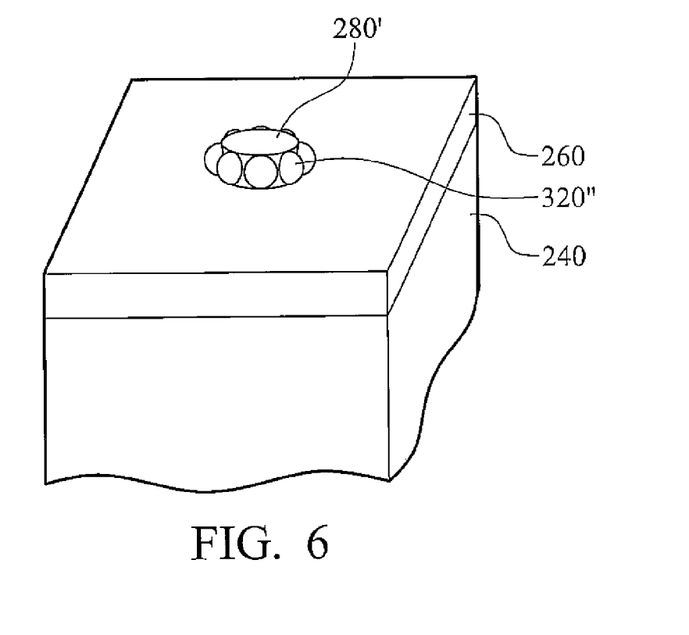

Referring to FIG. 6, a heat treatment process is performed to transform the patterned seeding layer 320' into a plurality of hemispherical grain structures 320'', thereby forming the hemispherical grain structures 320'' on the sidewall of the patterned second mask layer 280'. Preferably, the manufacturing process conditions are precisely controlled in order that height of sidewall of the patterned second mask layer 280' is substantially the same size as the hemispherical grain structure 320''. Thus, only one hemispherical grain is formed in the vertical direction of the sidewall of the patterned second mask layer 280'. A subsequently formed capacitor will consequently be provided with the largest possible surface area. In one example, the patterned second mask layer 280' is polysilicon with a thickness of about 10 nm to 100 nm, and the patterned seeding layer 320' is amorphous silicon (a-Si). Under such circumstances, a seeding method may be performed to allow the amorphous silicon to grow into HSG silicon (hemispherical grained silicon). The size of the HSG silicon is about 10 to 100 nm. By properly controlling the manufacturing process, only one HSG silicon is formed in the vertical direction of the sidewall of the polysilicon. Additionally, when the seeding layer 320 is made of another material which can be transformed into nano crystal, one of ordinary skill may perform a heat treatment or other similar method to form the nano crystal structure on the sidewall of the patterned second mask layer 280'.

Figure 7:
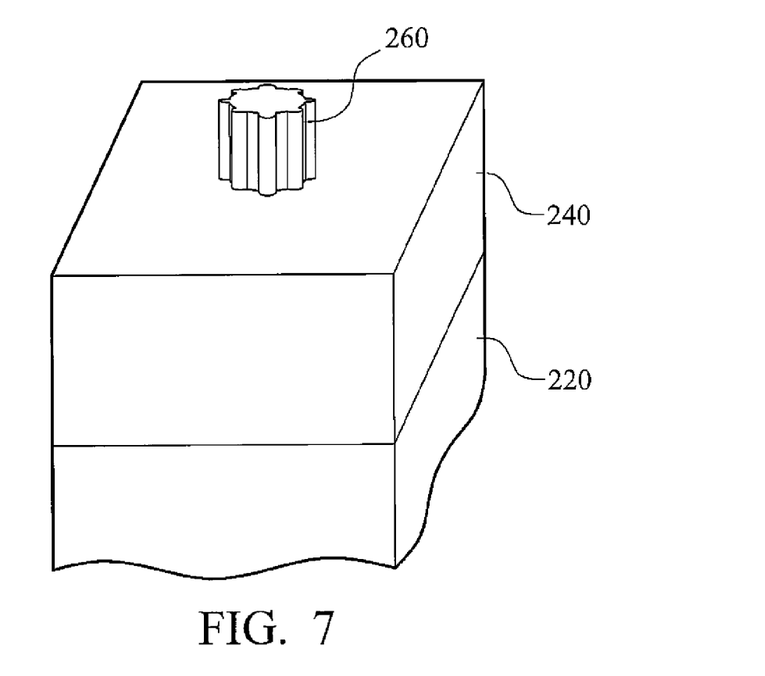

Referring to FIG. 7, an anisotropic etching is carried out. The first mask layer 260 is etched by using the patterned second mask layer 280' and the hemispherical grain structures 320'' as a mask. The patterned second mask layer 280' and the hemispherical grain structures 320'' are then removed. Thus, the first mask layer 260 is patterned to form a cylinder pattern having a plurality of grooves on its surface. In other words, the cylinder pattern has a concave-convex surface. The anisotropic etching may include plasma etching or reactive ion etching (RIE).

Figure 8:
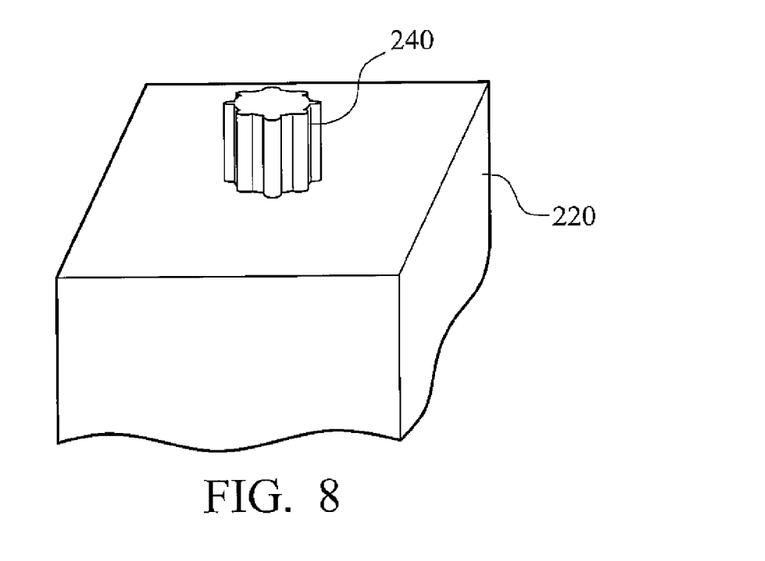

Referring to FIG. 8, an anisotropic etching is performed to etch the bottom electrode material layer 240 by using the patterned first mask layer 260 as a mask. The patterned first mask layer 260 is then removed. The cylinder pattern having a plurality of grooves on its surface (or the cylinder pattern having a concave-convex surface) is thus transferred to the bottom electrode material layer 240. Accordingly, a patterned bottom electrode material layer 240 having a plurality of grooves on its surface (or having a concave-convex surface) is formed on the interlayer dielectric layer 220. Next, a capacitor dielectric layer (not shown) and a top electrode material layer (not shown) are sequentially formed on the patterned bottom electrode material layer 240, thereby forming a solid cylinder capacitor having a plurality of grooves on its surface (or having a concave-convex surface) and electrically connecting to the contact plug 120.

In a preferred embodiment of the invention, a thickness of the bottom electrode material layer 240 is more than about 1 µm, and a thickness of the patterned second mask layer 280' or the hemispherical grain structure 320" is about 10 nm to 100 nm. It is difficult to achieve an optimal profile of the bottom electrode layer by directly using the relatively thin second mask layer 280' and hemispherical grain structures 320" as an etching mask. As a result, the first mask layer 260, which is thicker than the second mask layer 280, is used as a mask for etching the bottom electrode material layer 240, rather than directly using the patterned second mask layer 280' and the hemispherical grain structure 320" as the mask for etching the relatively thick bottom electrode material layer 240.

EMBODIMENT 2

A second embodiment of a method for forming a capacitor will now be described with reference to FIGS. 9-17. In this embodiment, elements similar to those described in FIGS. 1-8 are only briefly described for clarity.

Figure 9:
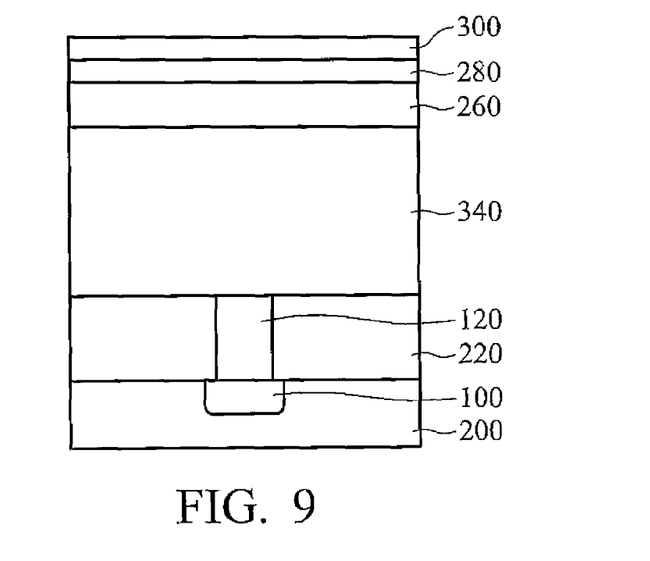
FIGS. 9-17 are schematic views showing an embodiment of a method for forming a capacitor.

Referring to FIG. 9, an integrated circuit substrate 200 with an interlayer dielectric layer 220 thereon is provided. A contact plug 120 is formed within the interlayer dielectric layer 220 and electrically connects to a source/drain region 100 in the integrated circuit substrate 200 and a bottom electrode of DRAM formed in subsequent processes. A material layer 340 is then deposited on the interlayer dielectric layer 220 and the contact plug 120. A first mask layer 260 is deposited on the material layer 340. A second mask layer 280 is deposited on the first mask layer 260. Finally, a photoresist layer 300 is formed on the second mask layer 280. The material layer 340 may include silicon oxide, silicon nitride, $ZrO_2$, $HfO_2$, $Ta_2O_5$, $TiO_2$, $Al_2O_3$ or other dielectric material. The material layer 340 may comprise a material having a high etching selectivity with respect to the first mask layer 260. In a preferred embodiment of the invention, the material layer 340 comprises silicon nitride; the first mask layer 260 comprises silicon oxide; and the second mask layer 280 comprises polysilicon.

Figure 10:
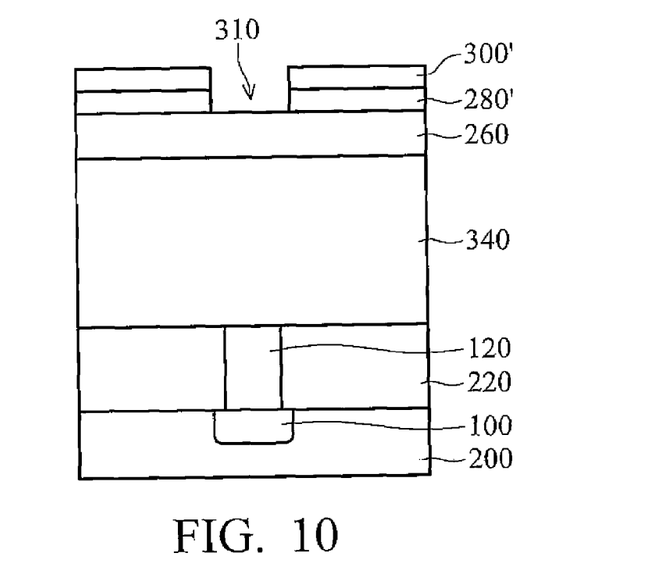

Referring to FIG. 10, the photoresist layer 300 and the second mask layer 280 are patterned to form a first opening 310 therein by using photolithography and etching processes. The opening 310 is provided at a predetermined region in which a capacitor will be formed. The patterned photoresist layer 300' is then removed while the patterned second mask layer 280' remains.

Figure 11:
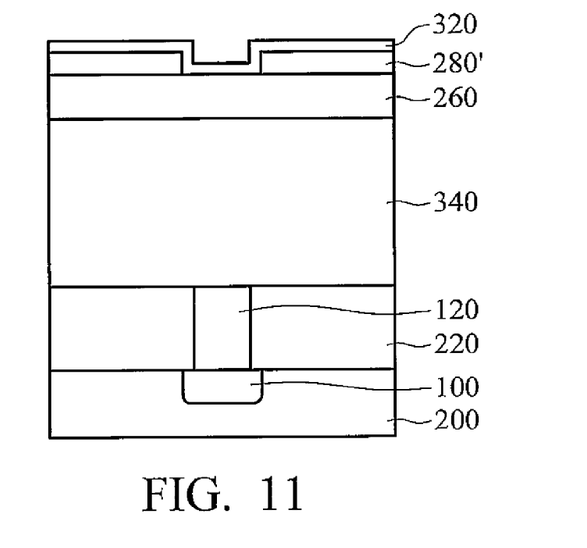

Referring to FIG. 11, a seeding layer 320 is conformally deposited on the patterned second mask layer 280' and in the opening 310. The seeding layer 320 preferably comprises a material which can be transformed into a hemispherical grain structure or nano crystal by performing a heat treatment or other similar methods. Preferably, the seeding layer 320 comprises silicon, germanium or PtO. In a preferred embodiment of the invention, the seeding layer 320 is amorphous silicon (a-Si).

Figure 12:
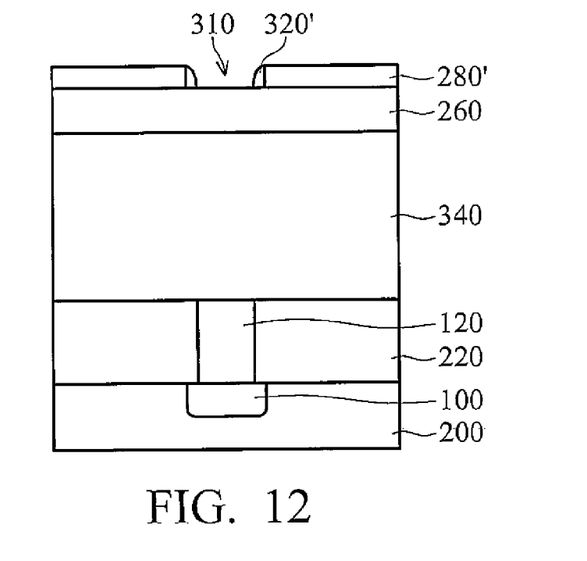
Figure 13:
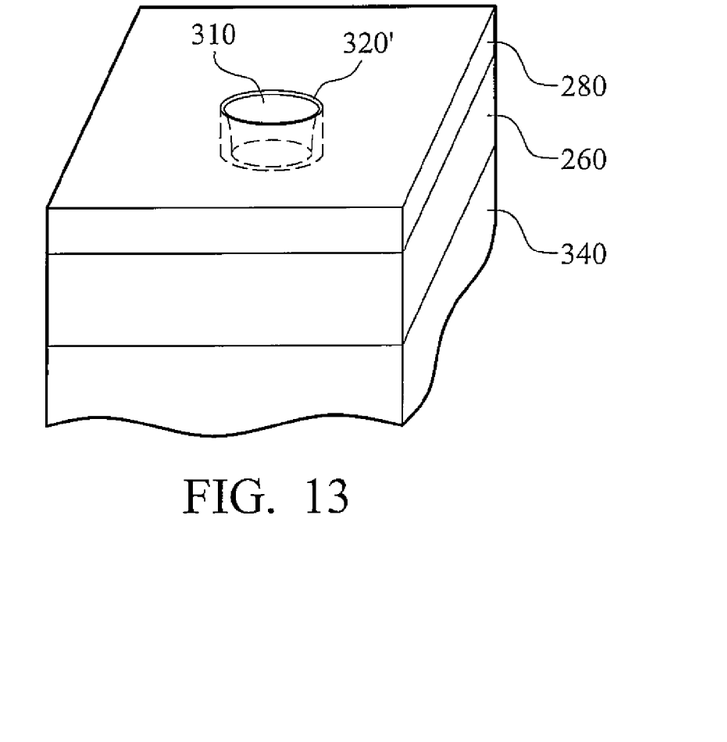

Referring to FIG. 12, an anisotropic etching is carried out to etch the seeding layer 320 on the top surface of the patterned second mask layer 280' and on the first mask layer 260. A patterned seeding layer 320' is thereby formed on a sidewall of the patterned second mask layer 280' in the first opening 310. The anisotropic etching may include plasma etching or reactive ion etching (RIE). After completing the etching process, a top view of the resulting structure is illustrated in FIG. 13.

Figure 14:
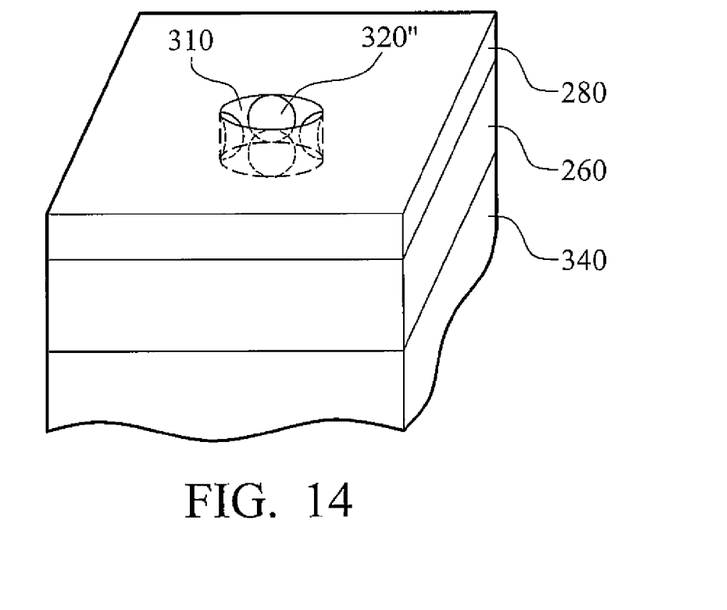

Referring to FIG. 14, a heat treatment process is performed to transform the patterned seeding layer 320' into a plurality of hemispherical grain structures 320", thereby forming hemispherical grain structures 320" on the sidewall of the patterned second mask layer 280' in the first opening 310. Preferably, manufacturing process conditions are precisely controlled in order that height of the sidewall of the patterned second mask layer 280' is substantially the same size as the hemispherical grain structure 320". Thus, only one hemispherical grain is formed in the vertical direction of the sidewall of the patterned second mask layer 280'. A subsequently formed capacitor will consequently be provided with the largest possible surface area. In one example, the patterned second mask layer 280' is polysilicon with a thickness of about 10 nm to 100 nm, and the patterned seeding layer 320' is amorphous silicon (a-Si). Under such circumstances, a seeding method may be performed to allow the amorphous silicon to grow into HSG silicon (hemispherical grained silicon). The size of the HSG silicon is about 10 to 100 nm. By precisely controlling the manufacturing process, only one HSG silicon is formed in the vertical direction of the sidewall of the polysilicon. When the seeding layer 320 comprises other material which can be transformed into nano crystal, one of ordinary skill may perform a heat treatment or other similar methods to form the nano crystal structure on the sidewall of patterned second mask layer 280' in the first opening 310.

Figure 15:
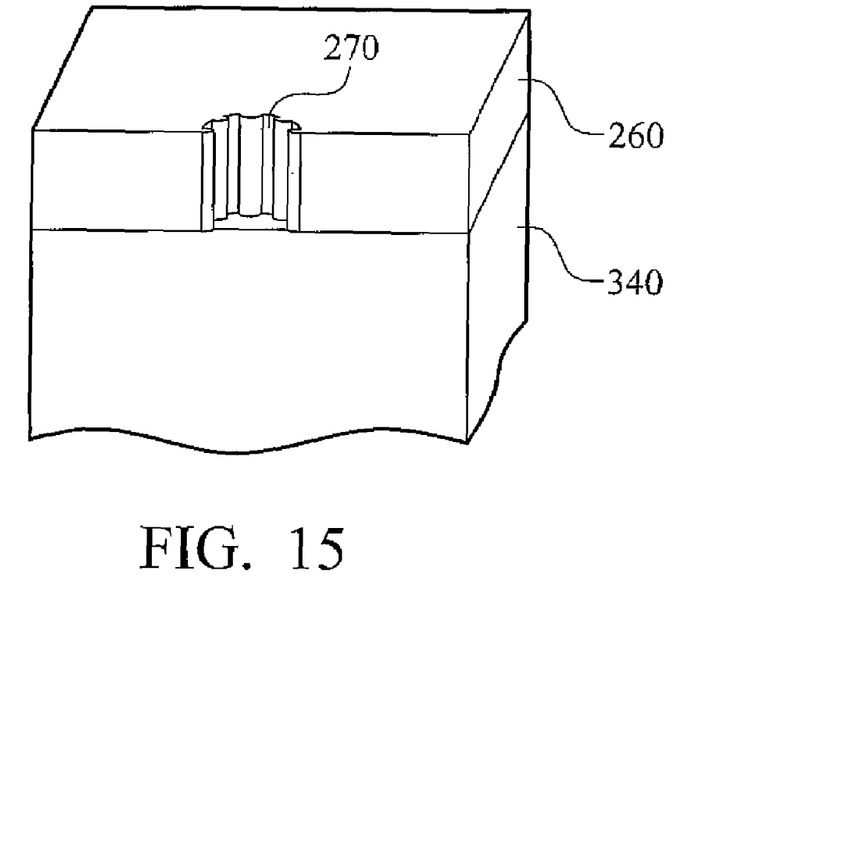

Referring to FIG. 15, an anisotropic etching is carried out. The first mask layer 260 is etched to form a second opening 270 therein by using the patterned second mask layer 280' and the hemispherical grain structures 320" as a mask. The patterned second mask layer 280' and the hemispherical grain structures 320" are then removed. The first mask layer 260 is thus patterned to form a plurality of grooves on a sidewall of the second mask layer 260 in the second opening 270. In other words, the sidewall of the second mask layer 260 in the second opening 270 is provided with concave-convex surface. The anisotropic etching may include plasma etching or reactive ion etching (RIE).

Figure 16:
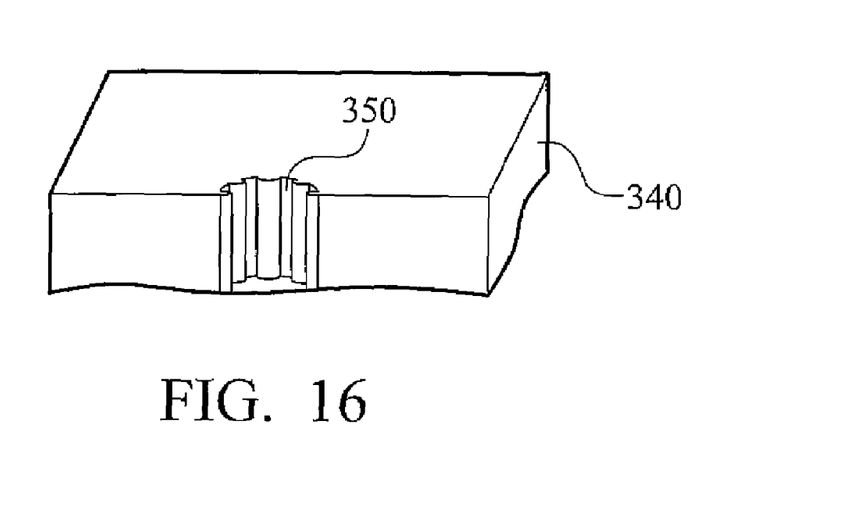

Referring to FIG. 16, an anisotropic etching is performed to etch the material layer 340 by using the patterned first mask layer 260 as a mask. Hence, a third opening 350 is formed within the material layer 340. The patterned first mask layer 260 is then removed. The material layer 340 is thus patterned to form a plurality of grooves on a sidewall of the material layer 340 in the third opening 350. In other words, the sidewall of the material layer 340 in the third opening 350 is provided with concave-convex surface.

Figure 17:
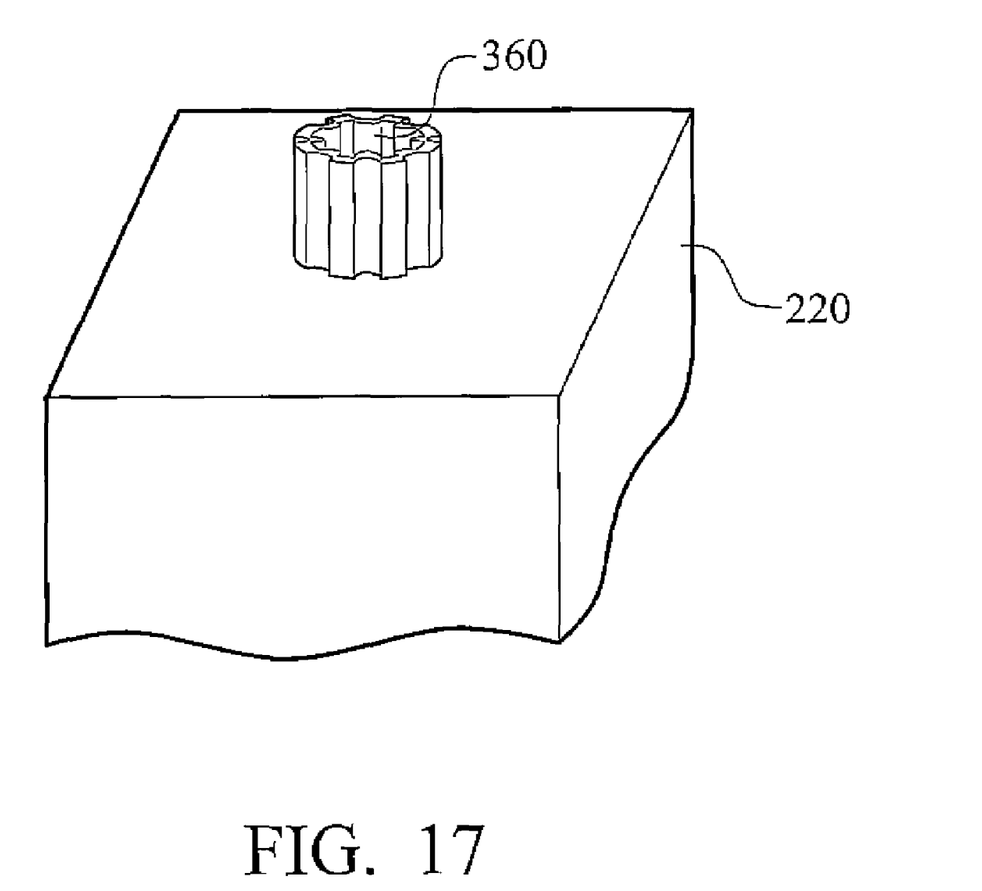

A layer of bottom electrode material is formed on the sidewall of the material layer 340 in the third opening 350. Afterwards, the material layer 340 is removed, thereby forming a hollow bottom electrode layer 360, as shown in FIG. 17. The hollow bottom electrode layer 360 is provided with a concave-convex surface. In other words, the hollow bottom electrode layer 360 has a plurality of grooves on its surface. Next, a capacitor dielectric layer and a top electrode layer are sequentially formed on the hollow bottom electrode layer 360, thereby forming a hollow cylinder capacitor having a plurality of grooves on its surface (or having a concave-convex surface) and electrically connecting to the contact plug 120.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a capacitor, comprising:
    providing a substrate;
    forming a bottom electrode material layer on the substrate;
    forming a first mask layer on the bottom electrode material layer;
    forming a second mask layer on the first mask layer;
    patterning the second mask layer to form a patterned second mask layer in a predetermined region for formation of a capacitor;
    forming a plurality of hemispherical grain structures on a sidewall of the patterned second mask layer;
    etching the first mask layer by using the hemispherical grain structures and the patterned second mask layer as a mask, thereby forming a patterned first mask layer having a pattern;
    transferring the pattern of the first mask layer to the bottom electrode material layer; and forming a capacitor dielectric layer and a top electrode layer on the bottom electrode material layer to form the capacitor.

2. The method for forming a capacitor as claimed in claim 1, wherein the hemispherical structures comprise nano crystal.

3. The method for forming a capacitor as claimed in claim 1, wherein the patterned first mask layer comprises a cylinder pattern having a plurality of grooves on its surface.

4. The method for forming a capacitor as claimed in claim 3, wherein the bottom electrode material layer becomes a cylinder pattern has a plurality of grooves on its surface after transferring the pattern from the patterned first mask layer.

5. The method for forming a capacitor as claimed in claim 4, wherein the cylinder pattern comprises a solid cylinder pattern.

6. The method for forming a capacitor as claimed in claim 1, wherein the step of forming the hemispherical grain structures on the sidewall of the patterned second mask layer comprises:

forming a seeding layer on the sidewall of the patterned second mask layer;
    performing a heat treatment to transform the seeding layer into the hemispherical structures.

7. The method for forming a capacitor as claimed in claim 6, wherein the step of forming the seeding layer on the sidewall of the patterned second mask layer comprises:
    conformally forming the seeding layer on the patterned second mask layer and on the first mask layer;
    etching a portion of the seeding layer to form spacers on the sidewall of the patterned second mask layer.

8. The method for forming a capacitor as claimed in claim 1, wherein height of the patterned second mask layer is substantially the same as size of the hemispherical grain structures.

9. The method for forming a capacitor as claimed in claim 1, wherein the hemispherical grain structures have about one grain in the height of the patterned second mask layer.

10. The method for forming a capacitor as claimed in claim 1, wherein forming the hemispherical grain structures comprises performing a seeding method.

11. The method for forming a capacitor as claimed in claim 1, wherein the bottom electrode material layer comprises TiN, Ru, Pt or polysilicon.

12. The method for forming a capacitor as claimed in claim 1, wherein the first mask layer comprises silicon oxide or silicon nitride.

13. The method for forming a capacitor as claimed in claim 1, wherein the first mask layer has a thickness of about 100 nm to 500 nm.

14. The method for forming a capacitor as claimed in claim 1, wherein the second mask layer comprises polysilicon or silicon nitride.

15. The method for forming a capacitor as claimed in claim 1, wherein the second mask layer has a thickness of about 10 nm to 100 nm.

16. The method for forming a capacitor as claimed in claim 1, wherein the seeding layer comprises amorphous silicon, germanium or PtO.

17. The method for forming a capacitor as claimed in claim 1, wherein the substrate comprises a source/drain region therein.

18. The method for forming a capacitor as claimed in claim 17, further comprising a contact plug formed on the substrate and electrically connecting to the source/drain region and the bottom electrode material layer.

* * * * *